United States Patent [19]

DeLuca et al.

[11] Patent Number: 4,574,094

[45] Date of Patent: Mar. 4, 1986

[54] METALLIZATION OF CERAMICS

[75] Inventors: Michael A. DeLuca, Holbrook; John F. McCormack, Roslyn Heights, both of N.Y.

[73] Assignee: Kollmorgen Technologies Corporation, Dallas, Tex.

[21] Appl. No.: 611,193

[22] Filed: May 21, 1984

Related U.S. Application Data

[63] Continuation-in-part of Ser. No. 502,748, Jun. 9, 1983, abandoned.

[51] Int. Cl.$^4$ .............................................. B05D 5/12
[52] U.S. Cl. ....................................... 427/96; 427/97; 427/98; 427/304; 427/305; 427/309; 427/404
[58] Field of Search ............... 427/304, 305, 309, 331, 427/404, 443.1, 96, 97, 98, 92, 123

[56] References Cited

U.S. PATENT DOCUMENTS

| | | | |
|---|---|---|---|
| 3,296,012 | 1/1967 | Statnecker . | |
| 3,671,291 | 6/1972 | Miller et al. | 427/305 |
| 3,672,986 | 6/1972 | Schneble et al. | 427/98 |
| 3,690,921 | 9/1972 | Elmore | 427/305 |
| 3,744,120 | 7/1973 | Burgess et al. . | |
| 3,766,634 | 10/1973 | Babcock et al. | |
| 3,772,056 | 11/1973 | Polichette et al. | 427/404 |
| 3,772,078 | 11/1973 | Polichette et al. | 427/404 |
| 3,907,621 | 9/1975 | Polichette et al. | |
| 3,925,578 | 12/1975 | Polichette et al. | 427/305 |
| 3,930,963 | 1/1976 | Polichette et al. | 427/97 |
| 3,959,547 | 5/1976 | Polichette et al. | 427/404 |
| 3,993,802 | 11/1976 | Polichette et al. | 427/96 |
| 3,994,430 | 11/1976 | Cusano et al. . | |
| 3,994,727 | 11/1976 | Polichette et al. | 427/96 |
| 4,046,620 | 9/1977 | Andrascek et al. | 427/309 |
| 4,428,986 | 1/1984 | Schachameyer . | |

OTHER PUBLICATIONS

Baudrand, "Plating and Surface Finishing", pp. 72-75, Oct. 1984.

Ameen et al., J. Electrochem. Soc. 1519 (1973).

*Primary Examiner*—Sadie L. Childs
*Attorney, Agent, or Firm*—Morgan, Finnegan, Pine, Foley & Lee

[57] ABSTRACT

An article comprised of metal directly and adherently bonded onto a ceramic substrate, and a process for producing same, wherein the ceramic is adhesion promoted with molten inorganic compound, treated with compounds that promote adsorption of catalyst for metal deposition, and plated with metal. Uniform surface coverage with catalyst and metal is ensured by the treatment with the adsorption promoters.

31 Claims, No Drawings

METALLIZATION OF CERAMICS

RELATED APPLICATIONS

This application is a continuation-in-part of application U.S. Ser. No. 502,748, filed June 9, 1983 now abandoned.

BACKGROUND OF THE INVENTION

1. Field of the Invention

This invention relates to metallized ceramic articles and to a metallized conductor pattern directly and adherently bonded onto a surface of a ceramic substrate, and an improved process for producing the same. More particularly, this invention relates to a printed circuit pattern directly and adherently bonded onto a surface of a ceramic substrate, and an improved process for producing the same employing material in solution to promote adsorption of a catalyst for metal deposition.

2. Description of the Prior Art

Metallized conductor patterns on ceramic substrates have been widely used in the electronic industry. For many years, ceramics have been metallized by high cost processes such as fused metal-glass pastes and thin film vacuum deposition techniques. Attempts to reproducibly make circuit patterns by direct electroless deposition have not been successful due to poor adhesion of the metal films to the substrate and non-reproducible and non-uniform surface coverage.

Printed circuits on ceramics including alumina were described as early as 1947. See "Printed Circuit Techniques", National Bureau of Standards, Circular 468 (1947) and National Bureau of Standards, Misc. Pub. 192 (1948). One type, known as a thin film circuit, consists of a thin film of metal deposited on a ceramic substrate by one of the vacuum plating techniques. In these techniques, a chromium or molybdenum film, having a thickness of about 0.02 microns, acts as a bonding agent for copper or gold conductors. Photolithography is used to produce high resolution patterns etched from the thin metal film. Such conductive patterns may be electroplated, up to 7 microns thick. Due to their high cost, thin film circuits have been limited to specialized applications such as high frequency applications and military applications where a high pattern resolution is vital.

Another type of printed circuit, known as a thick film circuit, consists of a metal and glass film fired on a ceramic substrate. Typically, the film has a thickness of about 15 microns. Thick film circuits have been widely used. Thick films are produced by screen printing in a circuit pattern with a paste containing a conductive metal powder and a glass frit in an organic carrier. After printing, the ceramic parts are fired in a furnace to burn off the carrier and sinter the conductive metal particles and fuse the glass, thereby forming glass-metal particle conductors. These conductors are firmly bonded to the ceramic by the glass and thus components may be attached to the conductors by soldering, wire bonding and the like.

Conductors in thick film circuits have only 30-60 percent of the conductivity of the pure metal. The high conductivity of pure metal is needed to provide interconnections for high speed logic circuits. Because conductors in thick film circuits do not have such high conductivity, they do not provide optimum interconnections for high speed logic circuits.

The minimum conductor width and the minimum space between conductors which can be obtained by screen printing and firing under special high quality procedures is 125 and 200 microns, respectively. However, under normal production conditions, these minima are 200 and 250 microns, respectively. For ceramic circuits requiring higher interconnection density, i.e., higher connectivity, multilayer techniques are used.

In the thick film multilayer process, a first layer of metal powder and glass frit is printed on a ceramic substrate and fired, typically at 850° C., in a furnace. Then, an insulating dielectric layer is screened over the conductor pattern, leaving exposed only the points at which contact is made to the next layer of metallization. This dielectric pattern also is fired at 850° C. Then, a second dielectric layer is printed and fired. Two layers of dielectric must be printed and fired to ensure that there are no pinholes. After the two layers of dielectric have been printed and fired, the next conductor layer is printed and fired making contact to the lower conductor layer as necessary through the openings left in the dielectric layers.

Typical multilayer ceramic packages contain two to six layers of metallization. Eight layers are not uncommon. For two layers of metallization, the substrate will be printed four times and fired at 850° C. seven times, and for four layer, thick film, multilayer ceramic, ten times. By the processes of the present invention, the same connectivity as a three or four layer film multilayer ceramic can be achieved by a two-sided, plated through hole, conductor pattern.

Attempts have been made to directly bond pure metal conductors to ceramic substrates including alumina in order to achieve high conductivity for ceramic based circuit patterns (see U.S. Pat. No. 3,744,120, to Burgess et al. and U.S. Pat. No. 3,766,634 to Babcock et al.). *Solid State Technology*, 18/5, 42 (1975) and U.S. Pat. No. 3,994,430, to Cusano et al. disclose a method for bonding copper sheets to alumina by heating the copper in air to form an oxide film on its surface. The copper sheet then is bonded through this film to alumina at a temperature between 1065° C. and 1075° C. in a nitrogen furnace. In order to obtain well adhered copper foil without blisters: (1) the copper foil must be carefully oxidized to a black surface; (2) the copper oxide thickness must be carefully controlled; (3) the amount of oxygen in the copper foil must be controlled; (4) the oxygen content of the nitrogen furnace must be maintained at a controlled level to maintain a very moderately oxidizing atmosphere; and (5) the temperature must be controlled within one percent. This extreme high temperature operation is difficult and expensive to tool, to operate and to control. If the aforementioned extremely stringent controls are not maintained, blisters and other adhesion failures in the copper foil to substrate are apparent. In spite of the difficult operating conditions, the process of Cusano et al. is being introduced into commercial application because of the need for the metallized product.

Although the above described systems are commercially used, the need for direct, simple metallization of ceramics with a pure metal conductor, such as copper, has prompted a continuous series of patents and proposed processes. See for example Apfelbach et al., Deutsches Patentschrift (DPS) Nos. 2,004,133; Jostan, DPS 2,453,192 and DPS 2,453,277; and Steiner DPS 2,533,524. See also U.S. Pat. No. 3,296,012 to Statnecker which discloses a method of producing a microporous surface for electrolessly plating alumina. Attempts to simply apply electroless metallization directly to ceramic substrates, have continually been tried and never been commercially successful. Even such toxic and corrosive materials as hydrogen fluoride were tried to allow the direct bonding of electroless metal to ceramics without extreme firing temperatures, Ameen et al., *J. Electrochem. Soc.*, 120, 1518 (1973). However, the hydrofluoric etch gave poor strength due to excessive attack on the surface of the ceramic.

Another attempt, disclosed in U.S. Pat. No. 3,690,921 to Elmore, involved the use of molten sodium hydroxide to first etch a ceramic surface before sensitizing the surface with stannous chloride sensitizer, activating the surface in palladium chloride, and electrolessly plating the surface. Although the sodium hydroxide etch provided a metal film circuit with good bond strength, nonetheless, it did not achieve commercial production. The problem was poor surface coverage by the electrolessly deposited metal. Although the metal deposit usually covered 90% of the surface area or even better, this was insufficient. Any imperfection in a metal film can result in an open circuit, that is, a complete operating failure, if the imperfection occurs in a fine line conductor pattern.

U.S. Pat. No. 4,428,986 to Schachameyer discloses a method for direct autocatalytic plating of a metal film on beryllia. The method comprises uniformly roughening the surface of the beryllia by immersing the beryllia in a 50% sodium hydroxide solution at 250° C. for 7 to 20 minutes, rinsing with water, etching the beryllia substrate with fluoroboric acid for 5 to 20 minutes, rinsing with water, immersing the beryllia in a solution of 5 g/l stannous chloride and 3N hydrochloric acid, rinsing with water, treating the beryllia with 0.1 g/l palladium chloride solution, rinsing with water, and then electrolessly plating nickel on the beryllia. However, the etching step removes the silica and magnesium from the grain boundaries of the beryllia, thereby weakening the beryllia surface. As a result, the method of Schachameyer was able to achieve only 250 psi (1.7 MPa) bond strength before the beryllia substrate broke. This bond strength is low, being approximately a third of the bond strength normal in thick film type circuits.

Other methods of forming printed circuit patterns on ceramic substrates are disclosed in U.S. Pat. Nos. 3,772,056, 3,772,078, 3,907,621, 3,925,578, 3,930,963, 3,959,547, 3,993,802 and 3,994,727. However, there is no teaching in these patents of how to solve the problem of poor surface coverage and inadequate bond strength to ceramic.

Quaternary amine surfactants and detergent blends containing cationic wetting agents have been used for about 20 years to prepare plastic substrates for reception of palladium catalysts for electroless plating. Illustrative compositions containing these surfactants are disclosed in U.S. Pat. No. 3,627,558 to Roger et al., U.S. Pat. No. 3,684,572 to Taylor and U.S. Pat. No. 3,899,617 to Courduvelis. However, heretofore these surfactants have not been suggested for preparing ceramic substrates for reception of palladium catalysts for electroless plating. Moreover, commercially available, alkaline cleaner-conditioners which are used to prepare plastic substrates for reception of palladium catalysts for electroless plating have not been found to be effective in preparing ceramic substrates for reception of palladium catalysts for electroless plating.

SUMMARY OF THE INVENTION

Objects of the Invention

An object of the present invention is to provide a process for applying a metal film to a ceramic substrate to obtain excellent surface coverage and a bond strength of at least 3 MPa, preferably at least 5 MPa.

An object of the invention is to produce a metal plated ceramic substrate which may be used for fine line circuit applications with highly pure metal conductors.

An object of the invention is to provide an electrolessly deposited, direct bonded conductor having excellent adhesion to a ceramic substrate and a process for producing the metal coated ceramic substrate.

An object of the invention is to provide a plated ceramic substrate which has conductors suitable for interconnection for high speed logic circuits and a process for producing the plated substrate.

An object of the invention is to provide a two-sided plated ceramic substrate with a through hole conductor pattern and a conductor density comparable to a three or four layer, thick film, multilayer ceramic.

Additional objects and advantages of the invention will be set forth in part in the description, or may be realized by practice of the invention, the objects and advantages being realized and attained by means of the methods, processes, instrumentalities and combinations particularly pointed out in the appended claims.

Brief Description of the Invention

The present invention is directed to a process for producing metal films on ceramic substrates including alumina, which have excellent surface coverage and bond strength (i.e., at least 3 MPa, preferably at least 5 MPa) as measured by the "dot pull test" described herein below. The present invention also includes ceramic substrates having printed circuit patterns formed from such films. The process of this invention may be used to treat ceramic substrates for electroless or electrolytic metal deposition. Metal deposits on the ceramic substrate are obtained having a thickness of at least 0.2 microns, preferably at least 2 microns, and conductor features typically with a width as low as 25 microns, preferably 50 microns.

The process of this invention comprises the steps of: (a) treating or adhesion promoting the surface of the ceramic with at least one molten inorganic compound; (b) contacting the adhesion promoted surface with a solution capable of promoting adsorption of catalyst on the treated surface; (c) sensitizing or catalyzing the treated surface for plating; and (d) depositing metal on the ceramic surface.

Detailed Description of the Invention

In one aspect, this invention concerns an improvement in a process for metallizing ceramic substrates which includes treating the surface to adherently receive metal and depositing metal on the treated surface. The improvement comprises treating the surface with a melt comprising one or more alkali metal compounds to adhesion promote or etch the surface. In a later step, the surface is exposed to an adsorption promoter selected from the group consisting of ethoxylated non-ionic compounds and nitrogen-containing compounds. The nitrogen-containing compounds are selected from the group consisting of quaternary compounds, amine oxides, alkanolamines, amides, betaines, amino acids and guanidine derivatives. The adsorption promoter is used in an amount sufficient to, and at a pH which will promote adsorption of catalyst on the surface and eliminate bare spots in an adherent metal layer formed on the surface or selected parts thereof. The adsorption promoter is either used in a pre-treatment step immediately followed by, or constituting part of, the solutions employed in the catalyzing sequence for rendering said surface receptive to deposition of metal. The thus treated surface or selected parts of the surface are plated in a metal depositing bath solution to form a uniform metal layer on said surface or selected parts thereof.

In another aspect, this invention concerns a process for making a printed circuit on a ceramic substrate comprising:
(a) treating the ceramic surface with a melt comprising one or more alkali metal compounds to adhesion promote or etch the surface;
(b) exposing the surface to an adsorption promoter selected from the group consisting of ethoxylated non-ionic compounds and nitrogen-containing compounds, the nitrogen-containing compounds being selected from the group consisting of quaternary compounds, amine oxides, alkanolamines, amides, betaines, amino acids and guanadine derivatives, in an amount sufficient to, and at a pH which will promote adsorption of catalyst on the surface and eliminate bare spots in an adherent metal layer formed on the surface or selected parts thereof;
(c) treating the ceramic surface exposed to the adsorption promoter with a catalyst for electroless metal deposition; and imposing a printed circuit pattern on the substrate by either: (1) depositing metal onto the catalyzed surface; and removing portions of the deposited metal to produce a metal printed circuit conductor pattern adhering to the surface of the ceramic substrate, or (2) applying a resist image on the catalyzed surface leaving exposed a printed circuit conductor pattern; and electrolessly depositing metal on the part of the catalyzed surface not printed with resist to form an adherent metal printed circuit conductor pattern on the substrate.

In another aspect, this invention concerns a process for producing a metallized conductor pattern on a ceramic substrate comprising:
contacting a surface of said substrate with a melt comprised of one or more alkali metal compounds for a time period sufficient to etch said surface;
rinsing said surface with an aqueous solution;
neutralizing said surface with an acid;
repeating said rinsing step;
contacting said surface with an adsorption promoter selected from the group consisting of ethoxylated non-ionic compounds and nitrogen-containing compounds, the nitrogen-containing compounds being selected from the group consisting of quaternary compounds, amine oxides, alkanolamines, amides, betaines, amino acids and guanadine derivatives, in an amount sufficient to, and at a pH which will promote adsorption of an activator solution, eliminate bare spots in an adherent metal layer formed on the surface or selected parts thereof;
contacting said surface with an activator solution which provides a noble metal catalyst, in the presence of said adsorption promoter, to render said surface receptive to electroless deposition of a metal; and
contacting said surface or selected parts thereof with a metal depositing solution for a time period sufficient to form a metal layer thereon.

In another aspect, this invention concerns an improvement in a process for metallizing ceramic substrates which includes treating the surface to adherently receive a metal, and depositing metal on the treated surface. The improvement comprises:
treating the surface with a melt comprising one or more alkali metal compounds to adhesion promote or etch the surface;
providing the surface with a conductive connector area for cathodic connection in subsequent electroplating;
exposing said surface to an adsorption promoter selected from the group consisting of ethoxylated non-ionic compounds and nitrogen-containing compounds, the nitrogen-containing compounds being selected from the group consisting of quaternary compounds, amine oxides, alkanolamines, amides, betaines, amino acids and guanadine derivatives, in an amount sufficient to, and at a pH which will promote adsorption of metal ions selected from Group Ib and Group VIII of the Periodic Table of Elements and eliminate bare spots in an adherent metal layer formed on the surface or selected parts thereof;
treating said surface with a solution comprising a metal selected from Group Ib and Group VIII of the Periodic Table of Elements to deposit metallic sites on the surface;
connecting said connectors area to the cathode pole of a power supply;
contacting the surface with a solution for electroplating a second metal, said solution being in contact with the anode of the power supply;
and electroplating the second metal on the surface to form a complete layer of said second metal on said surface or selected parts thereof.

In still another aspect, this invention concerns a ceramic article comprised of a ceramic substrate with a uniform coating of metal formed by treating the surface of the ceramic substrate with a melt comprising one or more alkali metal compounds and in a later step exposing said surface to an adsorption promoter, selected from the group consisting of ethoxylated non-ionic compounds and nitrogen-containing compounds, the nitrogen-containing compounds being selected from the group consisting of quaternary compounds, amine oxides, alkanolamines, amides, betaines, amino acids and guanadine derivatives, in an amount sufficient to, and at a pH which will promote adsorption of catalyst on the surface and eliminate bare spots in an adherent metal layer formed on the surface or selected parts thereof; adsorbing catalyst on the surface; and depositing a coating of metal on the surface from a metal depositing bath.

Any metal films may be deposited on the surface of a ceramic substrate in accordance with the present invention. Typically, copper, nickel, silver or cobalt metal films are electrolessly deposited.

The ceramic surface first is treated at high temperature with a substance which will provide an etched surface necessary to create a strong bond between the metal layer deposited and the ceramic substrate. The preferred materials for this purpose are at least one alkali metal compound in the molten state. The preferred alkali metal compounds include sodium hydroxide, potassium hydroxide, sodium carbonate and potassium nitrate, and potassium hydrogen sulfate.

Suggested procedures for etching with molten alkali are described in U.S. Pat. No. 3,690,921 to G. V. Elmore and in Ameen et al., supra. Both of these disclosures described procedures in which sodium hydroxide is heated to a temperature of 450° C. Many alkali metal compounds are suitable for adhesion promotion, e.g., etching of ceramics. It is preferred to use compounds with lower melting points.

Alternatively, the melting points of the alkali metal compound(s) may be depressed by dissolving up to 60% by weight, preferably up to 20% by weight, of low melting materials or even liquids in the alkali metal compound(s). Examples of such melting point depressants which are believed to to be within the scope of this invention include stannous chloride, nitric acid, water, sodium and potassium formate, potassium acetate, Rochelle salts, borax, and the hydrates of lithium bromide, iodide, iodide and phosphate, and potassium pyrophosphate. Sometimes, it may be preferable to avoid the hydroxides for safety reasons and for ease of neutralization. Typical alkali metal compounds suitable for use in this invention and their melting points as reported in *Lange's Handbook of Chemistry*, Eleventh Edition (1972) are as follows:

| Alkali Metal | Melting Points °C. | | | |
|---|---|---|---|---|
| | Anion | | | |
| | Hydroxide | Nitrate | Carbonate | Hydrogen Sulfate |
| Lithium | 445 | 261 | 618 | 171 |
| Sodium | 328 | 308 | 851 | >325 |
| Potassium | 360 | 334 | 891 | 214 |
| Rubidium | 300 | 310 | 837 | — |
| Cesium | 272 | 414 | — | — |

Eutectic mixtures such as a mixture of potassium hydroxide and sodium hydroxide or a mixture of sodium carbonate and potassium nitrate also may be used to etch the substrate. The former type of mixture preferably has a percent by weight ratio of 59:41 of KOH to NaOH with a melting point of 170° C.

The alkali metal compounds used as etchants should be heated to a molten state. Depending upon the amount of melting point depressant(s) present, the etchant composition is heated to a temperature above about 150° C., preferably above about 300° C., and more preferably between about 300° C. and about 600° C.

Typical of the ceramic substrates etched by the molten compounds employed herein are aluminas, beryllias, titanates, forsterite, mullite, steatite, porcelains and mixtures of the foregoing.

The preferred time for etching aluminas with the molten compound is between 5 minutes and 20 minutes. For ceramic substrates with lower melting points (less refractory), such as beryllias, titanates, mullite, fosterite, steatites and porcelains, the preferred time for etching with the molten compound is less than 5 minutes.

Typical of the metal deposition solutions used are electroless plating solutions such as nickel, cobalt, gold, copper. See U.S. Pat. Nos. 3,485,643; 3,607,317; 3,589,916; and the like. Electrolytic deposition solutions also may be used in the practice of this invention.

In the processes described by Elmore, sodium hydroxide is rinsed from the ceramic surface with water, and then the ceramic surface is neutralized with dilute sulfuric acid and rinsed again before sensitizing the surface with stannous chloride, rinsing and seeding with palladium chloride to catalyze for electroless metal plating.

These processes are unreliable and frequently result in incomplete surface coverage with electrolessly formed metal deposits. This condition is completely unsatisfactory for production. With prolonged immersion in both the stannous chloride sensitizer solution and the palladium chloride seeder solution as well as incomplete rinsing steps, it sometimes may be possible to get complete surface coverage with metal. These steps, however, are not practical in production. Prolonged immersion in the sensitizer prevents economical throughput of work, and incomplete rinsing after the stannous chloride leads to loosely adhering precipitate particles forming in the seeder and in the electroless plating solutions and to the rapid decomposition of these solutions.

The use of unitary catalyst solutions prepared from both stannous chloride and palladium chloride is well known in the printed circuit and plating-on-plastic arts. Typical catalyst solutions are in U.S. Pat. No. 4,187,198 to Zeblisky and U.S. Pat. No. 3,961,109 to Kremer et al. Such catalyst solutions may be advantageously used in plating on ceramics over the two step sensitizing and seeding solutions as described by Elmore.

Applicants have discovered that adsorption of the species rendering the surface receptive to metal deposition, i.e., sensitizer, seeder or catalyst, and that eventually surface coverage of the metal deposit is greatly enhanced by treatment of the etched ceramic surface with a compound that is adsorbed on such ceramic surface and promotes adsorption of the sensitizing species over the whole surface, and surprisingly, provides complete coverage. Among the compounds that can be adsorbed and promote adsorption of the sensitizer are certain nitrogen-containing compounds. These adsorption promoters may be selected from the group consisting of quaternary compounds, amine oxides, alkanolamines, amides, betaines, amino acids and guanidine derivatives.

Suitable quaternary compounds are believed to include complex quaternary surfactants (Varex 68 ®, commercially available from Sherex Chemical Company Inc., Dublin, Ohio 43017), quaternary ammonium compounds such as quaternary ammonium chlorides (commercially available as Emulsifier Four ® and Emulsifer Five ® from Tomah Products Inc., Milton, Wisc. 53563), polyethoxylated oleyl and stearic quaternary ammonium chlorides (commercially available as Ethoquad 0/12 ® and Ethoquad 18/12 ® from Armak Ind. Chem. Div., Chicago, Ill. 60690); polypropoxylated quaternary ammonium chlorides (commercially available as Emcol CC-9 ®, Emcol CC-36 ®, Emcol CC-42 ®, Emcol CC-55 ® and Emcol CC-57 ® from United Chemical Corp., N.Y., N.Y. 10022), and quaternary pyridinium compounds such as cetyl pyridinium bromide.

A suitable amine oxide is believed to be myristylcetyldimethylamine oxide (commercially available as Ammonyx MCO ® from Onyx Chemical Company, Jersey City, N.J. 07302).

Suitable alkanolamines are ethanolamine and are believed to include block copolymers of ethylene oxide and propylene reacted with ethylenediamine (commercially available as Tetronic 1504 ® from BASF Wyandotte Corp., Parsippany, N.J. 07054).

Suitable amides are believed to include alkylolamides such as lauric ethoxylated amide (commercially available as Unamide L-5 ® from Lonza Inc., Fair Haven, N.J. 07410), and the coco ethoxylated amides (commercially available as Unamide C-5 ® from Lonza Inc., Fair Haven, N.J. 07410, and Ammidox C-5 ® from Stepan Chemical Company, Northfield, Ill. 60093).

A suitable amino acid and guanadine derivative is believed to be creatine.

Suitable betaines include tallow betaine surfactants, e.g., Mirataine ® (commercially available from Miranol Chemical Co. Inc., Dayton, N.J. 08810).

Combinations of adsorption promoters also are useful for promoting the adsorption of either stannous ion sensitizers or unitary noble metal catalyst solutions comprising both palladium and tin, or other catalyst combinations of noble metals and elements from Group IV of the Periodic Table.

Surprisingly, it has been found not only that certain nitrogen-containing surfactants are suitable for this invention but also that the pH of the nitrogen-containing surfactant solutions should be acidic.

Non-noble metal catalysts for electroless metal deposition also may be used for carrying out this invention. Suitable non-noble metal catalysts include those described by Polichette et al. U.S. Pat. Nos. 3,772,056; 3,925,578; 3,993,802; and 3,907,621, the disclosures of which are incorporated herein by reference. It has been further discovered that the adsorption of these non-noble metal catalysts on the etched ceramic surface, and thus the eventual surface coverage of the metal deposit also is enhanced by treatment of the etched ceramic surface with a compound that promotes adsorption of the non-noble metal catalyst. Compounds that promote adsorption of a non-noble metal catalyst include nonionic surfactants such as the alkylphenoxypolyglycidols (e.g., nonylphenoxypolyglycidol commercially available as Olin 6G ® from Olin Chemical Corp., Stanford, Conn. 06904).

While not wishing to be bound by theory, it is believed that adsorption of the strongly negatively charged catalytic species, such as stannous chloride or the unitary palladium chloride-tin chloride catalysts, is enhanced by cationic surface active agents and adsorption promoters containing positive nitrogen dipoles. On the other hand, the non-noble metal catalysts are frequently neutral or only mildly negative or mildly positive species, so that adsorption is enhanced by nonionic surfactants.

The adsorption promoter(s) may be used in an aqueous solution at concentrations above about 10 mg per liter, preferably above about 100 mg per liter, more preferably above about 1 gram per liter, and below about 50 grams per liter, preferably below about 10 grams per liter, and more preferably below about 6 grams per liter. There should be sufficient adsorption promoter to completely cover the ceramic surface with an adsorbed layer. If the concentration of the adsorption promoter is too low or the contact time with the adsorption promoter solution is too short, the ceramic surface will not be completely covered with an adsorbed layer. This condition is characterized by "skip plating" in subsequent metal deposition. The upper limit for the concentration is determined by practical economic considerations. Specifically, if too high a concentration of adsorption promoter is used, excessive rinsing is required to avoid buildup of adsorption promoter in the sensitizer and plating baths subsequently used which would result in blistering of a subsequent metal deposit of poorly adherent metal layers.

It has been found that the pH of the adsorption promoter solution should be selected to give good adsorption on the substrate. For nitrogen-containing surfactants, an acidic pH is preferred; a more preferred pH is above 1 and below 5. It also has been found that nonionic surfactants operate best as adsorption promoters at neutral pH, i.e., at a pH between 4 and 11.

The nitrogen-containing, adsorption promoters can be used as a pretreatment or predip for the ceramic substrate after adhesion promotion, rinsing, neutralizing and rinsing again; and before treating with, e.g., stannous chloride sensitizer. It has been found that with such pretreatment, the sensitizer is quickly adsorbed on the etched ceramic substrate so that the immersion in sensitizing solution is not unduly prolonged. In addition, the adsorbed tin species is securely adsorbed so that it is not inadvertently removed in a conventional rinsing step.

Numerous processes are employed in the manufacture of printed circuit boards. As will be understood by those skilled in the art, these printed circuit manufacturing processes may be used in conjunction with the adhesion promoting step of this invention and with the step of rendering the ceramic surface receptive to metallization in order to produce metallized ceramic printed circuit boards.

Other modes of operating this invention are, inter alia, disclosed in the examples.

EXAMPLE I

Two white 96% alumina substrates, 30 mm×30 mm and 0.4 mm thick were adhesion promoted by immersion in an alkaline cleaning solution (Altrex ® commercially available from BASF-Wyandotte, Wyandotte, Mich. 48192) for 10 minutes at a temperature of 60° C., water rinsed for 1 minute at 25° C., dipped in a solution of sodium hydroxide (760 g/l), removed and allowed to drain. The resulting wet ceramic substrates were placed on edge in a support fixture, and dried for 10 minutes at 175° C. to remove water in the sodium hydroxide film on the substrates. Then, the substrates were heated in a furnace for 15 minutes at 450° C. to melt the sodium hydroxide, which melt roughened and adhesion promoted the surface. After cooling, the ceramic substrates were rinsed in water, rinsed in 20% sulfuric acid at 25° C. for 2 minutes and subsequently rinsed in deionized water for 2 minutes at 25° C.

After adhesion promotion, one of the substrates was immersed for 5 minutes in an aqueous adsorption promoter solution containing an amphoteric surfactant (tallow betaine surfactant) 1.4 g/l, a nonionic surfactant (nonylphenoxy polyethoxyethanol) 1 g/l, and ethanolamine 1 ml/l (the solution pH was 2) and then was rinsed in water. Both alumina substrates then were coated with copper by the following procedure:

(1) Immerse for 10 minutes at room temperature in a sensitizer solution consisting of 59 grams of stannous chloride dissolved in a liter of 0.12 molar hydrochloric acid solution;
(2) Rinse in deionized water at room temperature;
(3) Immerse for 2 minutes at room temperature in an activator solution of 0.1 grams palladium chloride dissolved in a liter of 0.012 molar hydrochloride acid; and (4) Plate for 30 minutes at room temperature in an electroless copper plating bath consisting of:

| | |
|---|---|
| copper (II) chloride | 6 g/l |
| ethylenediamine tetra-2-propanol | 17 g/l |
| formaldehyde | 8 g/l |
| block copolymer of ethylene oxide and propylene oxide (Pluronic P-85, BASF, Wyandotte, Mich.) wetting agent | 1 ml |
| sodium hydroxide | 15 g/l |
| sodium cyanide | 10 mg/l |
| potassium sulfide | 0.8 mg/l |
| sodium mercaptobenzothiazole | 0.1 mg/l |

The ceramic substrate which was immersed in the surfactant solution received a uniform, adherent, electrolessly deposited copper layer. The ceramic substrate which was not treated with the surfactant solution exhibited skip plating, i.e., portions of the surface were not covered with copper.

In another comparative test, the procedure of Example I was repeated, using as the adsorption promoter solution a commercial alkaline cleaner-conditioner containing a quaternary ammonium chloride, alkyl phenoxy polyethoxyethanol and triethanolamine. The ceramic substrate so treated exhibited skip plating.

EXAMPLE II

The procedure of Example I was repeated except that as the adsorption promoter three different solutions were used. One adsorption promoter solution contained 1.4 g/l of the tallow betaine surfactant at a pH of 2. A second adsorption promoter solution contained 1.4 g/l of the tallow betaine surfactant at a pH of 4.6. A third adsorption promoter solution contained 1.4 g/l of the tallow betaine surfactant at a pH of 9.9.

After the electroless copper deposition step, the ceramic substrates treated at a pH of 2 and a pH of 4.6 both had uniform adherent copper deposits free from skip plating, blisters or other defects. The ceramic substrate treated at a pH of 9.9 exhibited skip plating.

EXAMPLE III

Example II was repeated except that 1 g/l solutions of monoethanolamine at a pH of 2 and a pH of 10.9, respectively, were used as the adsorption promoter solutions. After electrolessly depositing copper, the ceramic substrate treated at a pH of 2 had a uniform, adherent copper surface, but the ceramic substrate treated at a pH of 10.9 exhibited skip plating.

EXAMPLE IV

A white 96% alumina substrate, 30 mm×30 mm and 0.4 mm thick was adhesion promoted by the procedure of Example I. It then was coated with copper by the following procedure:
(1) Immerse for 5 minutes in an aqueous adsorption promoter solution containing an amphoteric surfactant (tallow betaine surfactant) a nonionic surfactant (nonylphenoxy polyethoxyethanol) and ethanolamine, the solution adjusted to a pH of 2.
(2) Rinse in water.
(3) Immerse for 2 minutes in a room temperature aqueous halide predip solution of 3.8 moles sodium chloride, 0.1 moles hydrochloric acid and 0.025 moles stannous chloride per liter.
(4) Immerse for 5 minutes in a catalyst solution having the composition shown below:

| | Catalyst Composition - grams/liter Halide: |
|---|---|
| Palladium | 0.15 |
| Stannous Chloride | 23 |
| Sodium Chloride | 226 |
| Hydrogen Chloride | 4.6 |
| Resorcinol | 1.2 |

(5) Rinse in water.
(6) Electrolessly deposit copper for 30 minutes at room temperature in an electroless copper plating solution consisting of:

| | |
|---|---|
| Copper sulfate | 10 g/l |
| Ethylenediamine tetra-2-hydroxypropanol | 17 g/l |
| Formaldehyde | 6 g/l |
| Block copolymer wetting agent | 10 mg/l |
| Sodium cyanide | 10 mg/l |
| Sodium hydroxide | To pH 13 |

A uniform coating of copper was obtained free of voids and skip plating. The copper clad ceramic was coated with a polyvinylcinnamate polymer (KPR, commercially available from Eastman Kodak Company), exposed, and developed with KPR Developer Solution to produce the negative resist image of a chip carrier on the copper clad substrate. The exposed copper surface, which was the desired chip carrier pattern, was electroplated in a copper electroplating solution (Copper Gleam PC, commercially available from Lea Ronal, Inc., Freeport, N.Y.) to a copper thickness of 0.01 mm. The resist then was removed with solvents, and the electroless copper film, outside the chip carrier image pattern, was removed by immersion in a solution of sodium persulfate thus producing a finished chip carrier with 132 conductors on 0.14 mm pitch fanning out to 0.36 mm pitch.

EXAMPLE V

The procedure of Example IV was repeated on both 90% and 96% alumina substrates using 0.4 mm thick substrates 75 mm by 75 mm. Instead of a chip carrier conductor pattern, eight copies of a copper conductor pattern for a hybrid circuit A/D (analog to digital) converter were produced on each substrate. The hybrid circuit conductor patterns have 125 micrometer wide pure copper conductors, input and output connections and all the interconnections for six integrated circuits and associated chip capacitors and resistors. After the circuit patterns were completed by removing the electroless copper film in the background, the individual hybrid circuits were cut out of the 75 mm by 75 mm wafer by a laser. Alternately, the individual circuit patterns are laser cut after the integrated circuits and chip resistors and capacitors are emplaced.

EXAMPLE VI

Example V was repeated except that the hybrid circuit conductor patterns were electroplated with nickel and gold over the electroplated copper. This produced a circuit with a clean smooth pure gold surface which is superior for wire bonding over screened gold paste thick film circuits.

EXAMPLE VII

A 64 pin chip carrier was produced on alumina substrate. The substrate was provided with laser drilled holes 0.4 mm in diameter and the chip carrier was produced by the method of Example IV except that the conductor pattern was plated through the holes and onto the reverse side.

EXAMPLE VIII

Four black ceramic substrates, 90% alumina (commercially available as BA-912 from NTK Technical Ceramic Division of NGK Spark Plug Co., Ltd., Mizuho, Nagoya, Japan), were adhesion promoted by the procedure of Example I. Three of the substrates were immersed in a 6 g/l solution of Olin 6G (nonylphenoxypolyglycidol). The immersion times were varied from 5 minutes to 1 hour.

The substrates then were immersed for 30 minutes at 65° C. in the following sensitizer solution:

| Sensitizer Solution | |
|---|---|
| sorbitol | 85 g/l |
| 2,6-anthraquinone disulfonic acid disodium salt | 11 g/l |
| cupric acetate | 5.6 g/l |
| cupric bromide | 0.35 g/l |
| nonylphenoxypolyglycidol | 1.5 g/l |
| fluorobic acid | to pH 4 |
| ethanol | 300 ml/l |

After immersion, excess solution was wiped from the substrates with a sponge, and the substrates were dried and exposed to a medium pressure mercury vapor lamp for 90 seconds to produce a layer of catalytic sites on the substrates. The catalytic sites were fixed in a solution of 100 ml of 37% formaldehyde and 40 grams of tetrasodium EDTA adjusted to pH 12.5 in enough water to make a liter.

After fixing, the substrates were rinsed and plated with an electroless copper deposit 10 micrometers thick. The plating was done in the following solution:

| copper sulfate | 0.04 mole/l |
|---|---|
| ethlenedinitrilotetra-2-propanol | 0.12 mole/l |
| formaldehyde | 0.05 mole/l |
| alkylphenoxyglycidolphosphate ester | 0.2 millimoles/l |
| sodium cyanide | 0.5 millimoles/l |
| potassium selanocyanote | 0.7 millimoles/l |
| pH | 12.8 |
| temperature | 56° C. |

After plating the substrates were rinsed, dried, and baked at 160° C. for 1 hour.

The ceramic substrate which had not been immersed in the 6 g/l solution of Olin 6G had "skip plating", i.e., it was not completely covered with copper.

The ceramic substrates that had been contacted with the 6 g/l solution of Olin 6G were completely coated with copper.

The adhesion of the deposited copper to the ceramic substrate was tested by the "dot pull test". The substrates then were imaged and etched by conventional photolithographic techniques, producing copper dots 2.5 mm in diameter. Wires were attached to the copper dots with solder and the force required to separate the copper dots from the ceramic substrate was measured. The following results were obtained:

| Surfactant Immersion Time | Bond Strength MPa |
|---|---|
| 0 min | Skip Plating Incomplete Coverage |
| 5 min | 10 |
| 15 min | 12 |
| 60 min | 8.2 |

EXAMPLE IX

The procedure of Example VIII was repeated except that only 5 minute immersion was used in the Olin 6G solution and in the sensitizer solution. The measured bond strength was 7.5 MPa.

EXAMPLE X

The procedure of Example VIII was repeated using a 30-minute immersion in a 3 g/l solution of the nonylphenoxypolyglycidol surfactant before the 30-minute immersion in the sensitizer solution. Equivalent adhesion and surface coverage without skip plating was obtained.

EXAMPLE XI

The procedure of Example VIII was repeated using a 30-minute immersion in the surfactant. In the exposure to the mercury vapor lamp, a photographic negative of a hybrid circuit pattern was positioned over the black alumina substrate. A real image of the hybrid circuit pattern was produced on the substrate by the light exposure. After the electroless copper deposition step, this real image had been converted to an adherent conductor pattern on the alumina substrate.

EXAMPLE XII

The procedure of Example XI was repeated substituting a 24 pin dual-in-line hybrid circuit package for the flat alumina substrate. The dual-in-line package had a cavity for reception of a hybrid circuit. Instead of inserting a hybrid circuit package into the cavity, a hybrid circuit pattern was produced directly on the floor of the cavity by the procedure of Example XI. The photographic negative was held in place against the floor of the cavity during the exposure.

The adherent, copper conductor pattern was produced directly on the floor of the cavity. The copper pattern was overplated with electrolessly deposited nickel and gold by standard electroless plating techniques. The hybrid circuit was completed by mounting integrated circuit chips and chip resistors and capacitors on the conductor pattern and making wire-bond connections to the 24 pins of the package.

The formation of the conductor pattern and mounting the integrated circuits directly on the floor of the package greatly improved the heat transfer from the integrated circuits through the hybrid circuit package, compared to the conventional method of forming the hybrid circuit on a separate piece of alumina and then bonding the alumina to the floor of the package.

EXAMPLE XIII

A catalyst concentrate is prepared according to the procedure disclosed in U.S. Pat. No. 3,961,109 to Kremer et al. An aqueous solution comprising palladium chloride, stannous chloride, sodium chloride, hydrochloride acid and resorcinol is prepared and heated.

After cooling, the solution is diluted to obtain a standard concentrate catalyst solution. Thirty-one milliliters of this concentrate are diluted to one liter with a 0.18 molar solution of sulfuric acid. The catalyst solution has the composition shown below:

|  | Catalyst Composition-grams/liter Chloride |
| --- | --- |
| Palladium | 0.15 |
| Stannous chloride | 18 |
| Sodium chloride | 5.6 |
| Hydrogen chloride | 0.6 |
| Resorcinol | 1.2 |
| Sulfuric acid | 18 |

Two alumina substrates are adhesion promoted as in Example I. One of the adhesion promoted substrates is immersed for five minutes in the adsorption promoter solution of Example I and rinsed with water. Both of the adhesion promoted substrates are metallized by the following procedure:

(1) Immerse the substrates in the catalyst for five minutes at room temperature.

(2) Rinse in water.

(3) Immerse in an accelerator solution comprising 3% fluoroboric acid in water.

(4) Rinse in water.

(5) Electrolessly deposit copper on the substrate using the electroless copper bath of Example I.

The alumina substrate which is not treated with the adsorption promoter exhibits skip plating. The alumina substrate which is treated with the adsorption promoter is completely covered with a uniform layer of copper.

What is claimed is:

1. In a process for metallizing a surface of a ceramic substrate which includes treating the surface to adherently receive metal and depositing metal on the treated surface, the improvement which comprises:

treating the surface with a melt comprising one or more alkali metal compounds to adhesion promote or etch the surface;

and in a later step exposing said surface to an adsorption promoter selected from the group consisting of ethoxylated non-ionic compounds and nitrogen-containing compounds, said nitrogen-containing compounds being selected from the group consisting of quaternary compounds, amine oxides, alkanolamines, amides, betaines, amino acids and guanidine derivatives, in an amount sufficient to, and at a pH which will promote adsorption of catalyst on the surface and eliminate bare spots in an adherent metal layer formed on the surface or selected parts thereof;

treating said surface with a catalyst solution for rendering said surface receptive to deposition of metal; and exposing the thus treated surface or selected parts of said surface to a metal depositing bath solution thus forming a uniform metal layer on said surface or selected parts thereof.

2. A process as defined in claim 1 wherein said melt further includes up to about 60% by weight of one or more materials which depress the melting point of said alkali metal compound(s).

3. A process as defined in claim 1 wherein said melt further includes up to about 20% by weight of one or more materials which depress the melting point of said alkali metal compound(s).

4. A process as defined in claim 1, wherein said alkali metal compound is selected from hydroxide, carbonates, nitrates and hydrogen sulfates and mixtures thereof.

5. A process as defined in claim 1, wherein said alkali metal compound is selected from carbonates and nitrates and mixtures thereof.

6. A process as defined in claim 1, wherein the adsorption promoter comprises said ethoxylated non-ionic compound.

7. A process as defined in claim 6 wherein said ethoxylated nonionic compound is present in an aqueous solution having a pH between about 4 and about 11 and at a concentration between about 10 mg/l and about 50 g/l.

8. A process as defined in claim 7 wherein said ethoxylated non-ionic compound comprises an alkylphenoxypolyglycidol.

9. A process as defined in claim 1, wherein the adsorption promoter comprises said nitrogen-containing compound.

10. A process as defined in claim 9 wherein said nitrogen-containing compound is present in an aqueous solution at an acidic pH and at a concentration between about 10 mg/l and about 10 g/l.

11. A process as defined in claim 10, wherein the adsorption promoter is selected from quaternary ammonium and pyridinium compound(s).

12. A process as defined in claim 9, wherein the adsorption promoter is selected from amine oxides.

13. A process as defined in claim 9, wherein the adsorption promoter is selected from the alkanolamines.

14. A process as defined in claim 13, wherein the alkanolamine comprises ethanolamine, the ethanolamine being present in an aqueous solution with an acidic pH.

15. A process as defined in claim 9, wherein the adsorption promoter is selected from amides.

16. A process as defined in claim 9, wherein the adsorption promoter is selected from the amino acids and guanadine derivatives.

17. A process as defined in claim 9, wherein the adsorption promoter is a betaine.

18. A process as defined in claim 15, wherein the betaine comprises a tallow betaine surfactant, the tallow betaine surfactant being present in an aqueous solution with an acidic pH.

19. A process as defined in claim 9, wherein a first metal layer is electrolessly formed and said layer is further plated up with one or more metals employing electroless or electroplating methods.

20. A process as defined in claim 1, wherein the alkali metal compound is heated above 150° C.

21. A process as defined in claim 1, wherein the alkali metal compound is heated above 300° C.

22. A process as defined in claim 1, wherein the alkali metal compound is heated between about 300° C. and about 600° C.

23. A process for making a printed circuit on a ceramic substrate comprising:

(a) treating the ceramic surface with a melt comprising one or more alkali metal compounds to adhesion promote or etch the surface;

(b) exposing the surface to a adsorption promoter selected from the group consisting of ethoxylated non-ionic compounds and nitrogen-containing compounds, the nitrogen-containing compounds being selected from the group consisting of quaternary compounds, amine oxides, alkanolamines, amides, betaines, amino acids and guanadine derivatives, in an amount sufficient to, and at a pH which will promote adsorption of catalyst on the surface and eliminate bare spots in an adherent metal layer formed on the surface or selected parts thereof;
(c) treating the ceramic surface exposed to the adsorption promoter with a catalyst for electroless metal deposition;
(d) depositing metal onto the catalyzed surface;
(e) removing portions of the deposited metal to produce a metal printed circuit conductor pattern adhering to the surface of the ceramic substrate.

24. A process as defined in claim 23, wherein the substrate is exposed to the adsorption promoter prior to catalyzing with a catalyst for electroless metal deposition.

25. A process as defined in claim 23, wherein metal is deposited by electroplating.

26. A process as defined in claim 23, wherein portions of the deposited metal are removed by etching.

27. A process as defined in claim 23, wherein the printed circuit comprises plated holes with metal plated walls.

28. A process of making a printed circuit on a ceramic substrate comprising:
(a) exposing the surface of the ceramic substate to one or more molten alkali metal compound(s) to roughen or adhesion promote the surface;
(b) exposing the surface to a adsorption promoter selected from the group consisting of ethoxylated non-ionic compounds and nitrogen-containing compounds, the nitrogen-containing compounds being selected from the group consisting of quaternary compounds, amine oxides, alkanolamines, amides, betaines, amino acids and guanadine derivatives, in an amount sufficient to, and at a pH which will promote adsorption of a catalyst for electroless metal deposition and eliminate bare spots in an adherent metal layer formed on selected parts of the surface;
(c) catalyzing the surface with a catalyst for electroless metal deposition;
(d) applying a resist image on the catalyzed surface leaving exposed a printed circuit conductor pattern; and
(e) electrolessly depositing metal on the exposed parts of the catalyzed surface to form an adherent metal printed circuit conductor pattern on the substrate.

29. A process as defined in claim 26 wherein catalyzing the surface includes applying a stannous ion sensitizer and a noble metal ion activator on the surface.

30. A process for producing a metallized conductor pattern on a ceramic substrate comprising:
contacting a surface of said substrate with a melt comprised of one or more alkali metal compounds for a time period sufficient to etch said surface;
rinsing said surface with an aqueous solution;
neutralizing said surface with an acid;
repeating said rinsing step;
contacting said surface with a adsorption promoter selected from the group consisting of ethoxylated non-ionic compounds and nitrogen-containing compounds, the nitrogen-containing compounds being selected from the group consisting of quaternary compounds, amine oxides, alkanolamines, amides, betaines, amino acids and guanadine derivatives, in an amount sufficient to, and at a pH which will promote adsorption of an activator solution, and eliminate bare spots in an adherent metal layer formed on the surface or selected parts thereof;
contacting said surface with an activator solution which provides a noble metal catalyst, in the presence of said adsorption promoter, to render said surface receptive to electroless deposition of a metal; and
contacting said surface or selected parts thereof with a metal depositing solution for a time period sufficient to form a metal layer thereon.

31. In a process for metallizing ceramic substrates which includes treating the surface to adherently receive a metal, and depositing metal on the treated surface, the improvement which comprises:
treating the surface with a melt comprising one or more alkali metal compounds to adhesion promote or etch the surface;
providing the surface with a conductive connector area for cathodic connection in subsequent electroplating;
exposing said surface to an adsorption promoter selected from the group consisting of ethoxylated non-ionic compounds and nitrogen-containing compounds, the nitrogen-containing compounds being selected from the group consisting of quaternary compounds, amine oxides, alkanolamines, amides, betaines, amino acids and guanadine derivatives, in an amount sufficient to, and at a pH which will promote adsorption of metal ions selected from Group Ib and Group VIII of the Periodic Table of Elements and eliminate bare spots in an adherent metal layer formed on the surface or selected parts thereof;
treating said surface with a solution comprising a metal selected from Group Ib and Group VIII of the Periodic Table of Elements to deposit metallic sites on the surface;
connecting said connectors area to the cathode pole of a power supply;
contacting the surface with a solution for electroplating a second metal, said solution being in contact with the anode of the power supply;
and electroplating the second metal on the surface to form a complete layer of said second metal on said surface or selected parts thereof.

* * * * *